United States Patent
Nair

(10) Patent No.: US 11,545,195 B2
(45) Date of Patent: Jan. 3, 2023

(54) MEMORY SYSTEM

(71) Applicant: KIOXIA CORPORATION, Tokyo (JP)

(72) Inventor: Prashob Ramachandran Nair, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/403,524

(22) Filed: Aug. 16, 2021

(65) Prior Publication Data
US 2022/0084567 A1    Mar. 17, 2022

(30) Foreign Application Priority Data
Sep. 16, 2020    (JP) .............................. JP2020-155774

(51) Int. Cl.
*G11C 7/10*    (2006.01)
*G11C 7/04*    (2006.01)

(52) U.S. Cl.
CPC .............. *G11C 7/1063* (2013.01); *G11C 7/04* (2013.01); *G11C 7/1069* (2013.01); *G11C 7/1096* (2013.01)

(58) Field of Classification Search
CPC ....... G11C 7/1063; G11C 7/04; G11C 7/1069; G11C 7/1096
See application file for complete search history.

(56) References Cited

U.S. PATENT DOCUMENTS

| | | | |
|---|---|---|---|
| 10,713,156 B2* | 7/2020 | Walker | G06F 12/023 |
| 2015/0094875 A1 | 4/2015 | Duzly et al. | |
| 2016/0179158 A1 | 6/2016 | Thomas et al. | |
| 2018/0090218 A1* | 3/2018 | Takada | G11C 16/0483 |
| 2018/0254090 A1 | 9/2018 | Dutta et al. | |
| 2018/0267744 A1 | 9/2018 | Miomo et al. | |
| 2019/0073007 A1 | 3/2019 | Izumi | |
| 2019/0094927 A1 | 3/2019 | Kuwano et al. | |

FOREIGN PATENT DOCUMENTS

| | | | |
|---|---|---|---|
| JP | 2019046321 | A | 3/2019 |
| JP | 2019057194 | A | 4/2019 |
| JP | 6640776 | B2 | 2/2020 |
| TW | 201528122 | A | 7/2015 |
| TW | 201809951 | A | 3/2018 |
| TW | 201833933 | A | 9/2018 |

* cited by examiner

*Primary Examiner* — Han Yang
(74) *Attorney, Agent, or Firm* — Kim & Stewart LLP

(57) ABSTRACT

According to one embodiment, a memory system includes a non-volatile semiconductor memory with a plurality of dies and a memory controller. A temperature sensor is provided for each of the dies. The temperature sensors measures a temperature of each die. The memory controller schedules execution of access commands for each of the dies based on the measured die temperature, a predetermined limit temperature for each of the dies, and the type of access command that has been received by the memory controller.

20 Claims, 14 Drawing Sheets

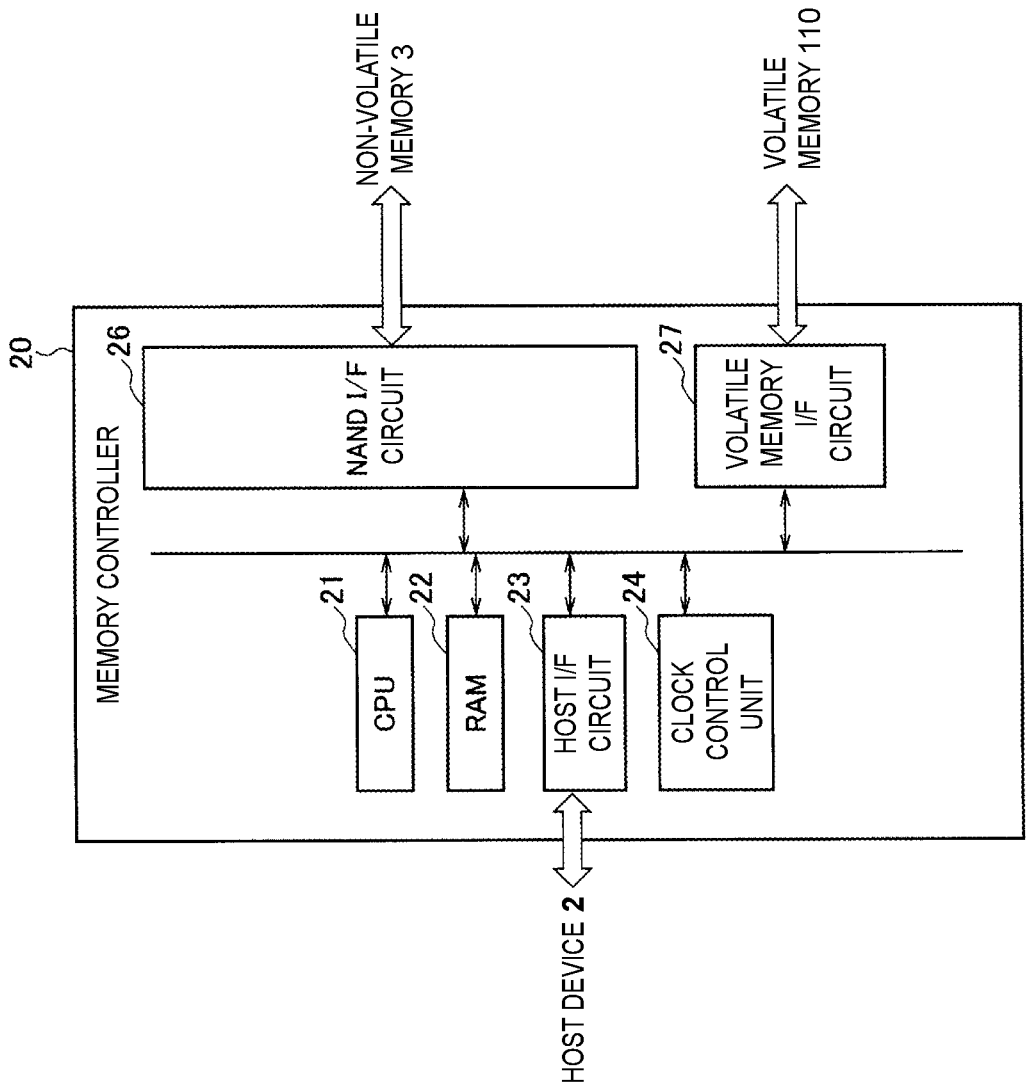

FIG. 7A

| DIE | 1 | 2 | 3 | 4 | 5 | 6 | 7 | 8 | 9 | 10 | ... |
|---|---|---|---|---|---|---|---|---|---|---|---|
| 10_1 | RD | ER | RD | RD | PG | RD | RD | – | – | – | ... |
| 10_16 | RD | PG | PG | ER | ER | PG | RD | RD | RD | RD | ... |

FIG. 7B

| DIE | LIMIT TEMPERATURE | CURRENT TEMPERATURE | MODELING INFORMATION | | | |
|---|---|---|---|---|---|---|
| | | | READ | PROGRAM | ERASE | RISING TIME |
| 10_1 | 73 | 69 | 0.1ms | 1.0ms | 5.0ms | 1.5ms |
| 10_2 | 72 | 70 | 0.1ms | 1.2ms | 5.2ms | 1.3ms |
| 10_16 | 73 | 71 | 0.1ms | 1.1ms | 5.1ms | 1.0ms |

*FIG. 11*

| IPC | WEIGHTING VALUE |
|---|---|
| READ | 1 |
| PROGRAM | 100 |
| ERASE | 500 |

MEMORY SYSTEM

CROSS-REFERENCE TO RELATED APPLICATION

This application is based upon and claims the benefit of priority from Japanese Patent Application No. 2020-155774, filed Sep. 16, 2020, the entire contents of which are incorporated herein by reference.

FIELD

Embodiments described herein relate generally to a memory system.

BACKGROUND

A memory system including a non-volatile memory in which memory cells are three-dimensionally stacked is known. In such a memory system, the performance may have to be adjusted so that the temperature does not rise too much.

BRIEF DESCRIPTION OF THE DRAWINGS

FIG. 1C is a block diagram of a memory controller according to an embodiment.

FIG. 7A is a diagram illustrating an example of a data structure of an IPC queue according to an embodiment.

FIG. 7B is a diagram illustrating an example of a data structure of a NAND modeling table according to an embodiment.

FIG. 11 is a schematic diagram of a weighting table used in temperature control by a memory system according to an embodiment.

DETAILED DESCRIPTION

Figure 1A:
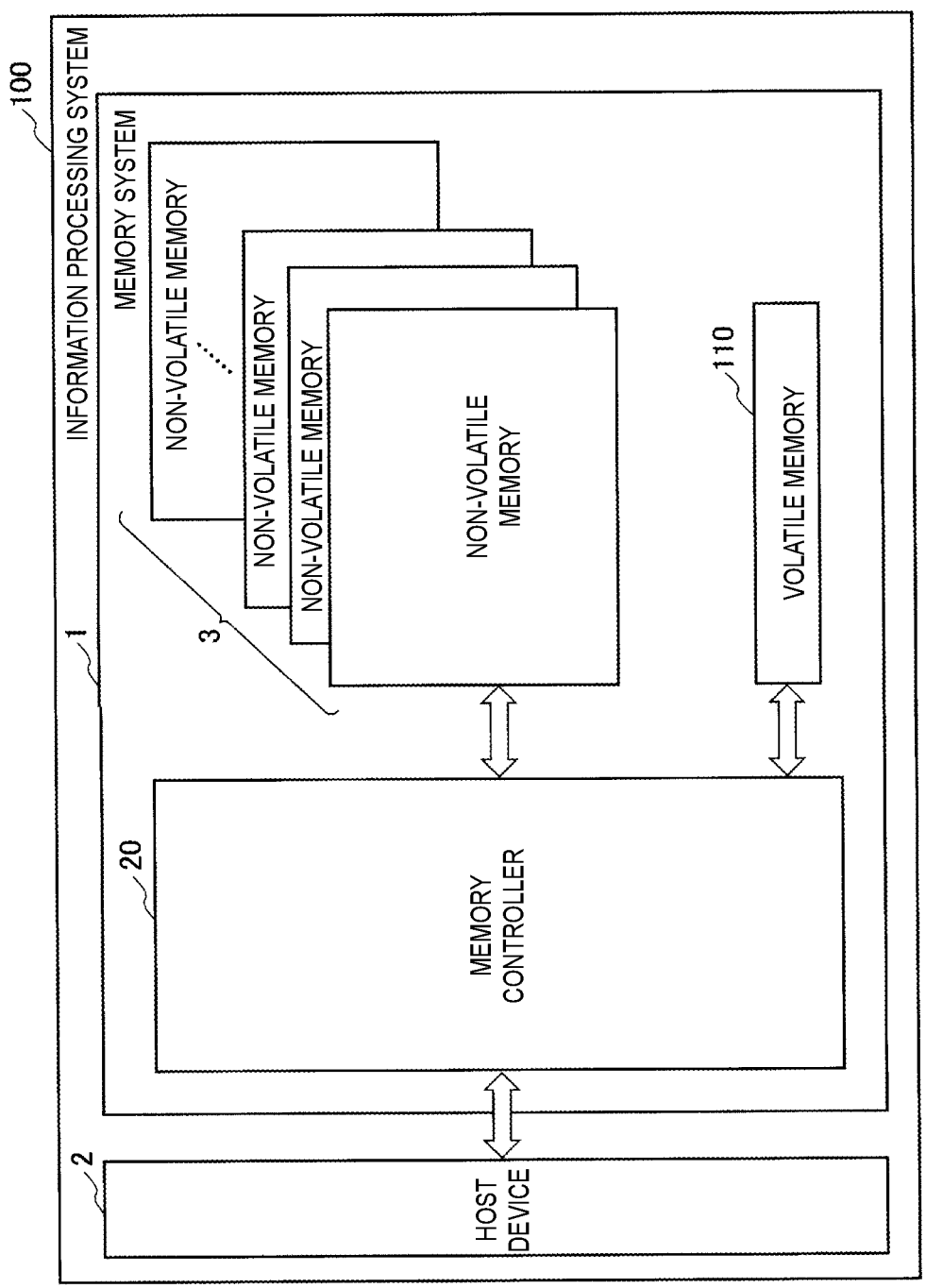
FIG. 1A is a block diagram of an information processing system including a memory system according to an embodiment.

Embodiments provide a memory system capable of avoiding an unwanted temperature rise and improving performance and reliability by controlling the temperature at a die level in a non-volatile semiconductor memory.

In general, according to one embodiment, a memory system includes a non-volatile semiconductor memory with a plurality of dies and a memory controller. Temperature sensors are provided for each of the dies. The memory controller is configured to receive access commands for accessing the non-volatile semiconductor memory, then control accessing of the non-volatile semiconductor memory according to the received access commands by scheduling execution of the received access commands for each die based on the temperature of the die as measured by the temperature sensor for the die, a preset limit temperature for each die, and access command type of the received access commands.

Hereinafter, certain example embodiments will be described with reference to the accompanying drawings. In the drawings, the same or substantially similar parts are designated by the same reference numerals.

In general, the drawings are schematic and the embodiments described below are provided for the purpose of explaining devices and methods embodying technical concepts of the present disclosure, and not to specify details regarding the materials, shapes, structures, and arrangement of the depicted and described parts. Thus, various modifications may be made to the embodiments without departing from the scope of the present disclosure.

(Configuration of Memory System)

FIG. 1A is a block diagram of an information processing system 100 including a memory system 1 according to an embodiment. The information processing system 100 includes a memory system 1 and a host device 2. The memory system 1 is configured as, for example, a solid state drive (SSD). Examples of the host device 2 include a computer including an interface (I/F) of serial advanced technology attachment (SATA) type, serial attached SCSI (SAS) type, and PCI Express® (PCIe) type.

As illustrated in FIG. 1A, the memory system 1 includes a plurality of non-volatile memories 3, a volatile memory 110, and a memory controller 20.

Each non-volatile memory 3 is a non-volatile memory (e.g., a memory chip or memory array) capable of storing data in a non-volatile manner. The non-volatile memory 3 is not limited to a NAND-type flash memory, and other examples include a NOR-type flash memory, a resistance change memory (ReRAM: Resistive Random Access Memory), a phase change memory (PCM), and a ferroelectric memory (FeRAM:Ferroelectric Random Access Memory). Furthermore, as for the non-volatile memory 3, a magnetic tunnel junction (MTJ) resistance changing element may also be applied. The plurality of non-volatile memories 3 may operate independently of each other. The number of non-volatile memories 3 is arbitrary. The plurality of non-volatile memories 3 and the memory controller 20 are connected to each other via a plurality of channels.

The volatile memory 110 is a volatile memory capable of temporarily storing data. The volatile memory 110 is, for example, a dynamic random access memory (DRAM) or a static random access memory (SRAM). The number of volatile memories 110 is arbitrary.

The memory controller 20 is an integrated circuit (IC) such as system-on-a-chip (SoC), field programmable gate array (FPGA), or an application specific IC (ASIC). The memory controller 20 may instruct the non-volatile memory 3 and the volatile memory 110 to perform various operations. The memory controller 20 may execute an operation based on a request from an external host device 2 or an operation not depending on a request from the host device 2.

Figure 1B:
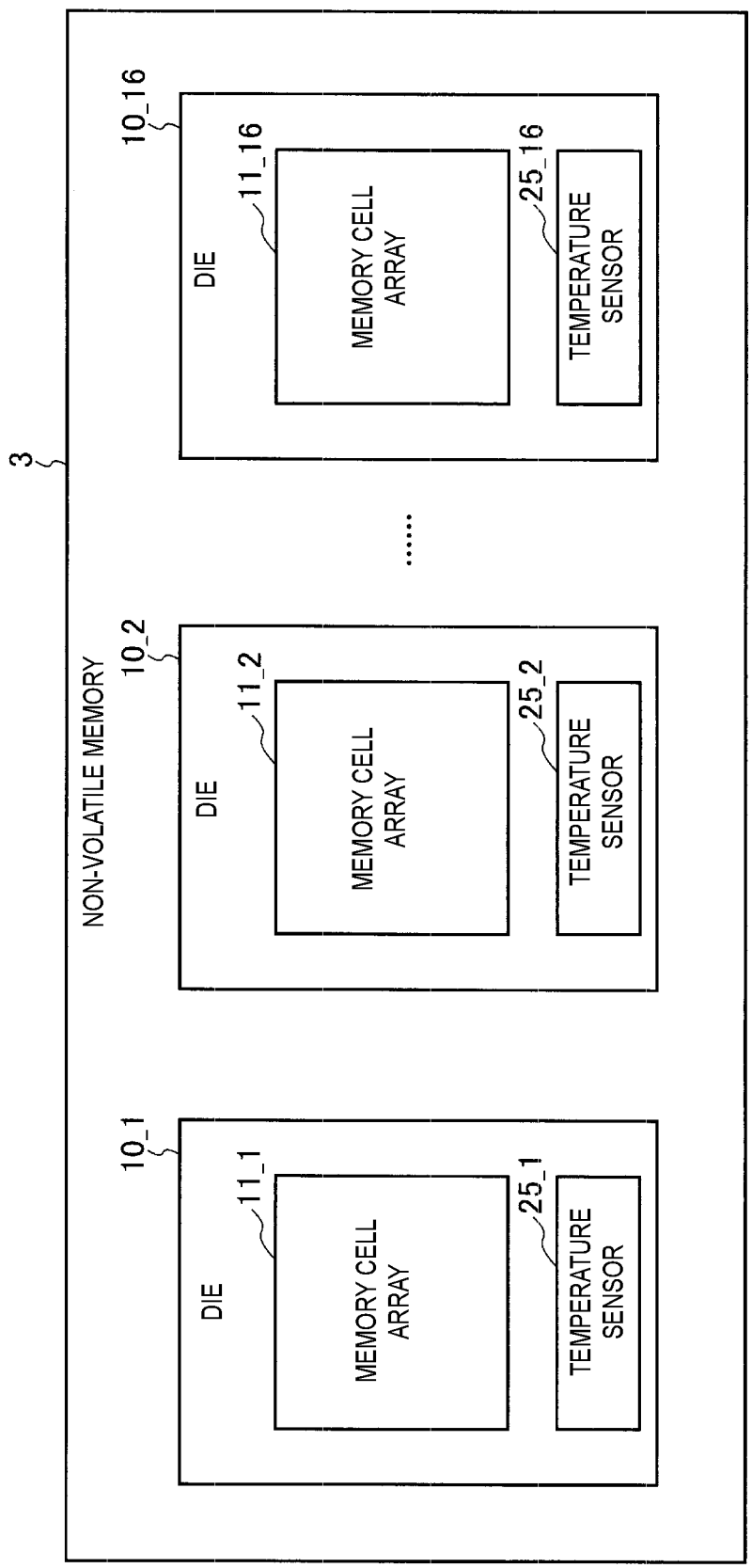
FIG. 1B is a block diagram of a non-volatile memory according to an embodiment.

FIG. 1B is a block diagram of the non-volatile memory 3 included in the memory system 1 illustrated in FIG. 1A. The non-volatile memory 3 includes a plurality of dies 10_1, 10_2, . . . 10_16. FIG. 1B illustrates an example with sixteen different dies (die 10_1, die 10_2, . . . die 10_16). For example, the die 10_1 includes one memory cell array 11_1 and one temperature sensor 25_1. Similarly, the die 10_2 includes one memory cell array 11_2 and one temperature sensor 25_2. Likewise, the die 10_16 includes one memory cell array 11_16 and one temperature sensor 25_16. The plurality of dies 10_1 to 10_16 may be collectively referred to as dies 10 or individually as a die 10 when it is unnecessary to distinguish between the different instances.

The plurality of memory cell arrays 11_1, 11_2, . . . 11_16 may be collectively referred to as memory cell arrays 11 individually as a memory cell array 11 when it is unnecessary to distinguish between the different instances. A plurality of temperature sensors 25_1, 25_2, . . . 25_16 may be collectively referred to as a temperature sensors 25 or individually as a temperature sensor 25 when it is unnecessary to distinguish between the different instances.

Each temperature sensor 25 measures the temperature in the die 10 in which it is located. The temperature sensor 25_1 measures the temperature of the entire die 10_1 and the temperature of the memory cell array 11_1 in the die 10_1. The measured temperatures are referred to by the CPU 21 (see FIG. 1C) of the memory controller 20 during a temperature control processing operation or the like.

FIG. 1C is a block diagram of a memory controller 20 included in the memory system 1 illustrated in FIG. 1A. As illustrated in FIG. 1C, the memory controller 20 includes a central processing unit (CPU) 21, a built-in memory 22 (RAM: random access memory), a host I/F circuit 23, a clock control unit 24, a NAND I/F circuit 26, and a volatile memory I/F circuit 27.

The CPU 21 may control the operation of the entire memory controller 20 by executing firmware. For example, the CPU 21 issues a read command in response to a read request received from the host device 2. The CPU 21 transmits the command being issued to the NAND I/F circuit 26. The CPU 21 may execute the temperature control process of the non-volatile memory 3.

The built-in memory 22 is used as a work area of the CPU 21. As for the built-in memory 22, a volatile memory such as a static random access memory (SRAM) is used. In the built-in memory 22, parameters for managing the non-volatile memory 3 and various management tables are loaded. For example, the built-in memory 22 stores a queue of instructions to be issued to the non-volatile memory 3. Furthermore, the built-in memory 22 stores an address conversion table (LUT: look up table) (or a portion thereof) for converting a logical address associated with the data stored in a block BLK of the non-volatile memory 3 into a physical block address (PBA) of the block BLK. The address conversion table can also be stored in the non-volatile memory 3. The address conversion table is read from the non-volatile memory 3 when the memory system 1 is started (initialized) and loaded into the built-in memory 22.

The host I/F circuit 23 is a hardware interface responsible for communication between the memory system 1 and the host device 2. The host I/F circuit 23 supports communication interface standards such as SATA, SAS, and PCIe®. For example, the host I/F circuit 23 controls the transfer of data, commands, and addresses between the memory system 1 and the host device 2. The host I/F circuit 23 is connected to the host device 2.

The clock control unit 24 generates a clock signal for use for operations of the CPU 21, the host I/F circuit 23, the NAND I/F circuit 26, the volatile memory I/F circuit 27, and the non-volatile memory 3. The clock control unit 24 supplies the generated clock signal to the CPU 21, the host I/F circuit 23, the NAND I/F circuit 26, the volatile memory I/F circuit 27, and the non-volatile memory 3.

The NAND I/F circuit 26 is connected to a plurality of non-volatile memories 3. The NAND I/F circuit 26 is a hardware interface responsible for communication between the memory controller 20 and each non-volatile memory 3.

The volatile memory I/F circuit 27 is connected to the volatile memory 110. The volatile memory I/F circuit 27 is a hardware interface responsible for communication between the memory controller 20 and the volatile memory 110. The volatile memory I/F circuit 27 is configured according to any one of several known volatile memory interface standards. The configuration of the volatile memory I/F circuit 27 may be changed based on the type of the volatile memory 110 used in the memory system 1.

The configuration of the memory controller 20 described above is an example. In other examples, the clock control unit 24 may be external to the memory controller 20.

(Configuration of a Die)

Next, from among the plurality of dies 10 included in the non-volatile memory 3, the configuration of the die 10_1 will be described as representative.

Figure 2:
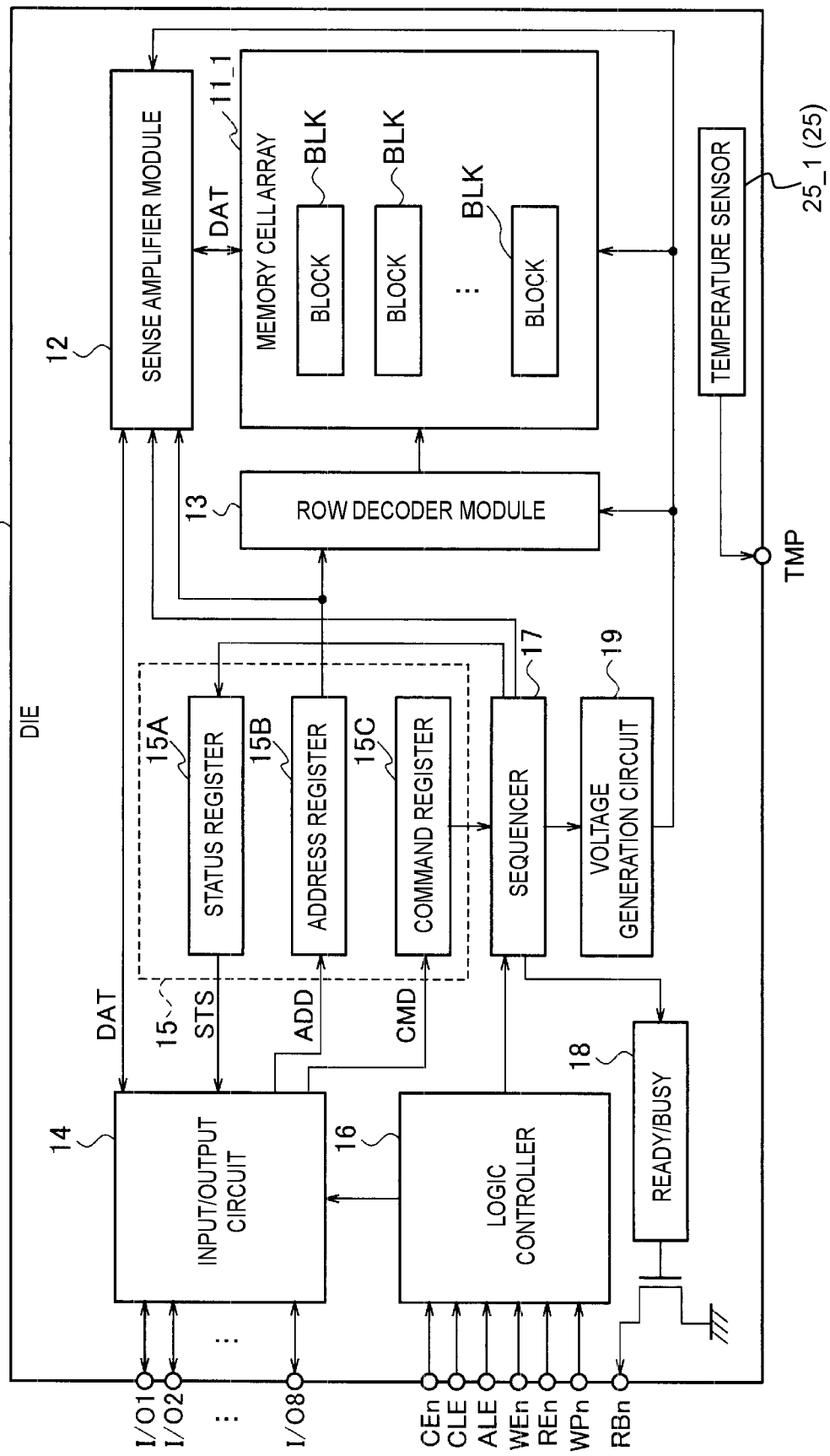
FIG. 2 is a block diagram of a die according to an embodiment.

FIG. 2 is a block diagram of the die 10_1 according to the embodiment. As illustrated in FIG. 2, the die 10_1 includes a memory cell array 11_1, a sense amplifier module 12, a row decoder module 13, an input/output circuit 14, a register 15, a logic controller 16, a sequencer 17, a ready/busy control circuit 18, a voltage generation circuit 19, and a temperature sensor 25_1.

The memory cell array 11_1 includes a plurality of blocks BLK. Each block BLK is a collection of non-volatile memory cells associated with a set of bit lines and word lines. The block BLK is, for example, a data erasing unit. For the blocks BLK, a multi-level cell (MLC) data storage method may be applied. Data of 2 bits or more may be stored in each memory cell by the MLC method. For example, a triple-level cell (TLC) method or a quad-level cell (QLC) method may be applied to the block BLK. Data of 3 bits may be stored in each memory cell by a TLC method. Data of 4 bits may be stored in each memory cell by a QLC method.

The sense amplifier module 12 outputs the data DAT read from the memory cell array 11_1 to the memory controller 20 via the input/output (I/O) circuit 14. Similarly, the sense amplifier module 12 transfers the write data DAT received from the memory controller 20 via the input/output circuit 14 to the memory cell array 11_1.

The row decoder module 13 may select a targeted block BLK on which to execute various operations based on the block address held in an address register 15B. Then, the row decoder module 13 may transfer the voltage supplied from the voltage generation circuit 19 to the selected block BLK.

The input/output circuit 14 transmits and receives, for example, 8-bit wide input/output signals I/O (the individual signals I/O1, I/O2 . . . I/O8) to and from the memory controller 20. For example, the input/output circuit 14 transfers the write data DAT included in the input/output signals I/O received from the memory controller 20 to the sense amplifier module 12. The input/output circuit 14 transmits the read data DAT transferred from the sense amplifier module 12 to the memory controller 20 as an input/output signal I/O.

The register 15 includes a status register 15A, an address register 15B, and a command register 15C. The status register 15A holds, for example, the status information STS of the sequencer 17. The status register 15A transfers the status information STS to the input/output circuit 14 based on the instruction of the sequencer 17. The address register 15B holds address information ADD transferred from the input/output circuit 14. For example, the column address and the block address included in the address information ADD are used in the sense amplifier module 12 and the row decoder module 13, respectively. The command register 15C holds a command CMD (command information) transferred from the input/output circuit 14.

The logic controller 16 may control the input/output circuit 14 and the sequencer 17 based on various control signals received from the memory controller 20. As for various control signals, for example, a chip enable signal CEn, a command latch enable signal CLE, an address latch enable signal ALE, a write enable signal WEn, a read enable signal REn, and a write protect signal WPn are used.

The signal CEn is a signal used to enable the die 10_1. The signal CLE is a signal used to notify the input/output circuit 14 that the signal input to the die 10_1 is a command CMD. The signal ALE is a signal that notifies the input/output circuit 14 that the signal input to the die 10_1 is the address information ADD. The signals WEn and REn are signals used to control the input and output of the input/output signal I/O to the input/output circuit 14. The signal WPn is a signal used to put the die 10_1 in a protected state, for example, when the power is turned on and off.

The sequencer 17 controls the overall operation of the entire die 10_1 based on the particular command CMD (if any) held in the command register 15C. For example, the sequencer 17 controls the sense amplifier module 12, the row decoder module 13, and the voltage generation circuit 19 to execute various operations such as a write operation and a read operation.

The ready/busy control circuit 18 may generate a ready/busy signal RBn based on the present operating state of the sequencer 17. The signal RBn is a signal whose value is set based on whether the die 10_1 is in a ready state (state permitting accepting an instruction from the memory controller 20) or the die 10_1 is in a busy state (state not permitting accepting an instruction from the memory controller 20).

The voltage generation circuit 19 generates a desired voltage based on the control of the sequencer 17. The voltage generation circuit 19 may supply the generated voltage to the memory cell array 11_1, the sense amplifier module 12, and the row decoder module 13. For example, the voltage generation circuit 19 applies desired voltages to a selected word line and a non-selected word line based on the page address held in the address register 15B.

The temperature sensor 25_1 measures the temperature of the die 10_1 (in which the temperature sensor 25_1 is disposed). The measured temperature is output as a signal TMP to the memory controller 20 during temperature control processing operations.

(Configuration of Memory Cell Array)

Next, an example of a configuration of planes in a memory cell array 11 included in a non-volatile memory 3 will be described.

Figure 3:
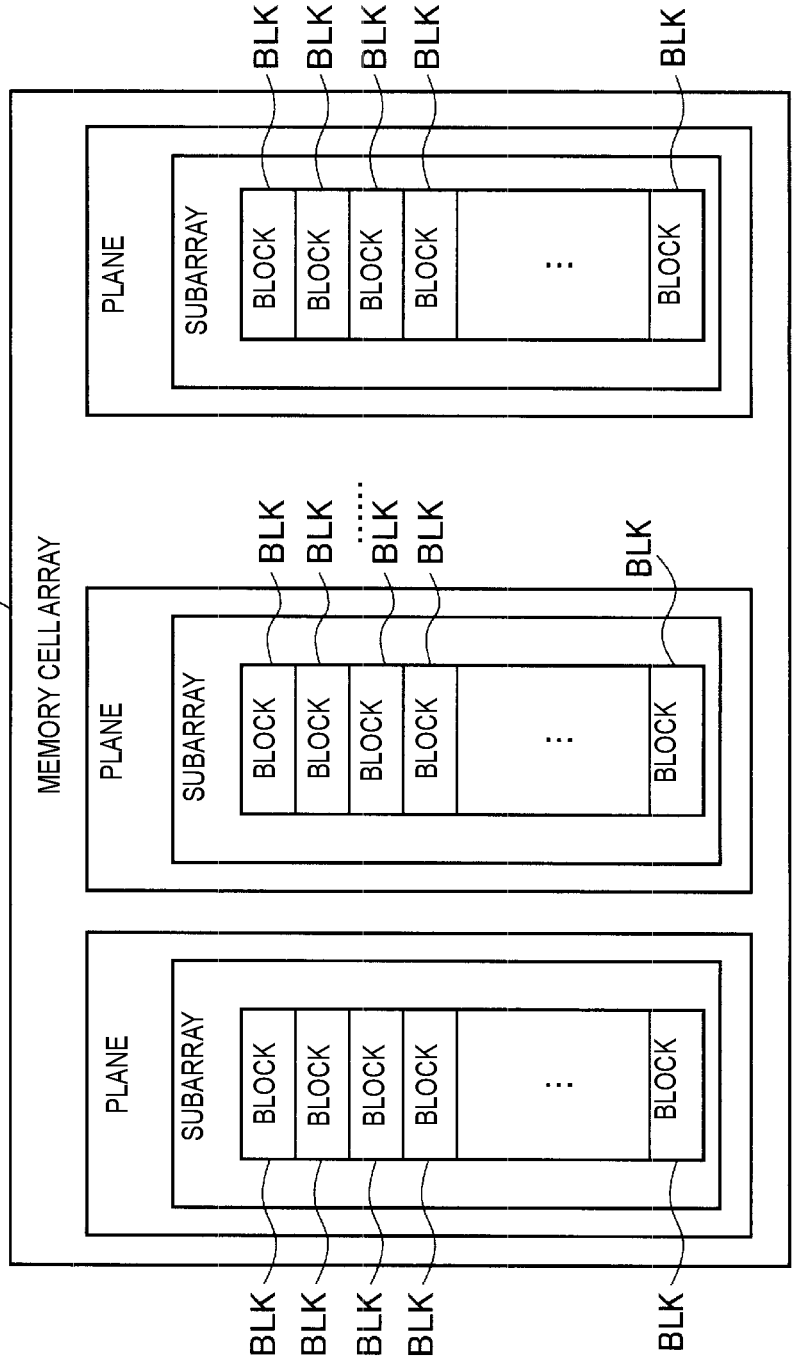
FIG. 3 depicts a plane configuration of a memory cell array according to an embodiment.

FIG. 3 is a block diagram of a plane configuration of the memory cell array 11_1 according to the embodiment. FIG. 3 illustrates an example in which the memory cell array 11_1 included in the die 10_1 is divided into a plurality of planes (or subarrays).

The memory cell array 11_1 includes a plurality of planes. In this example, each plane has its own subarray. Each subarray includes a plurality of blocks BLK.

Figure 4:
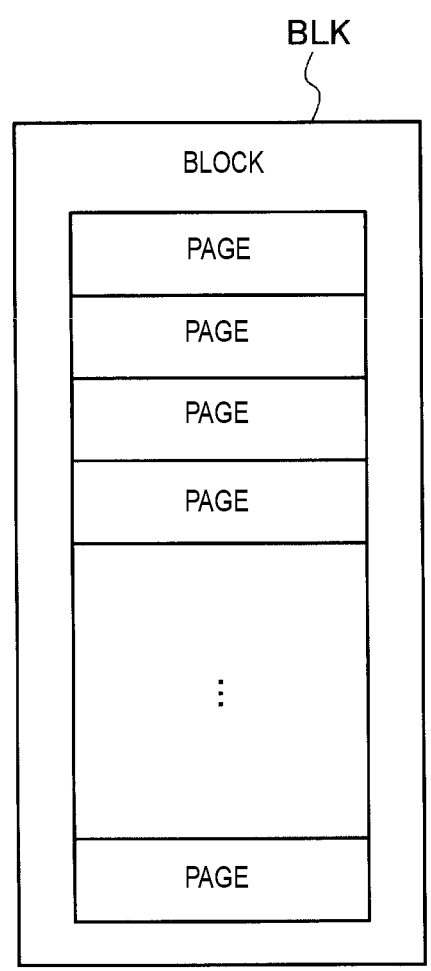
FIG. 4 depicts a configuration of a block according to an embodiment.

FIG. 4 is a block diagram illustrating a configuration of a memory block included in the memory cell array 11_1 illustrated in FIG. 3. FIG. 4 illustrates a configuration example of a block BLK illustrated in FIG. 3. Each block BLK includes a plurality of pages.

(Configuration of Block)

Next, a circuit configuration example of a block BLK included in the non-volatile memory 3 will be described.

Figure 5:
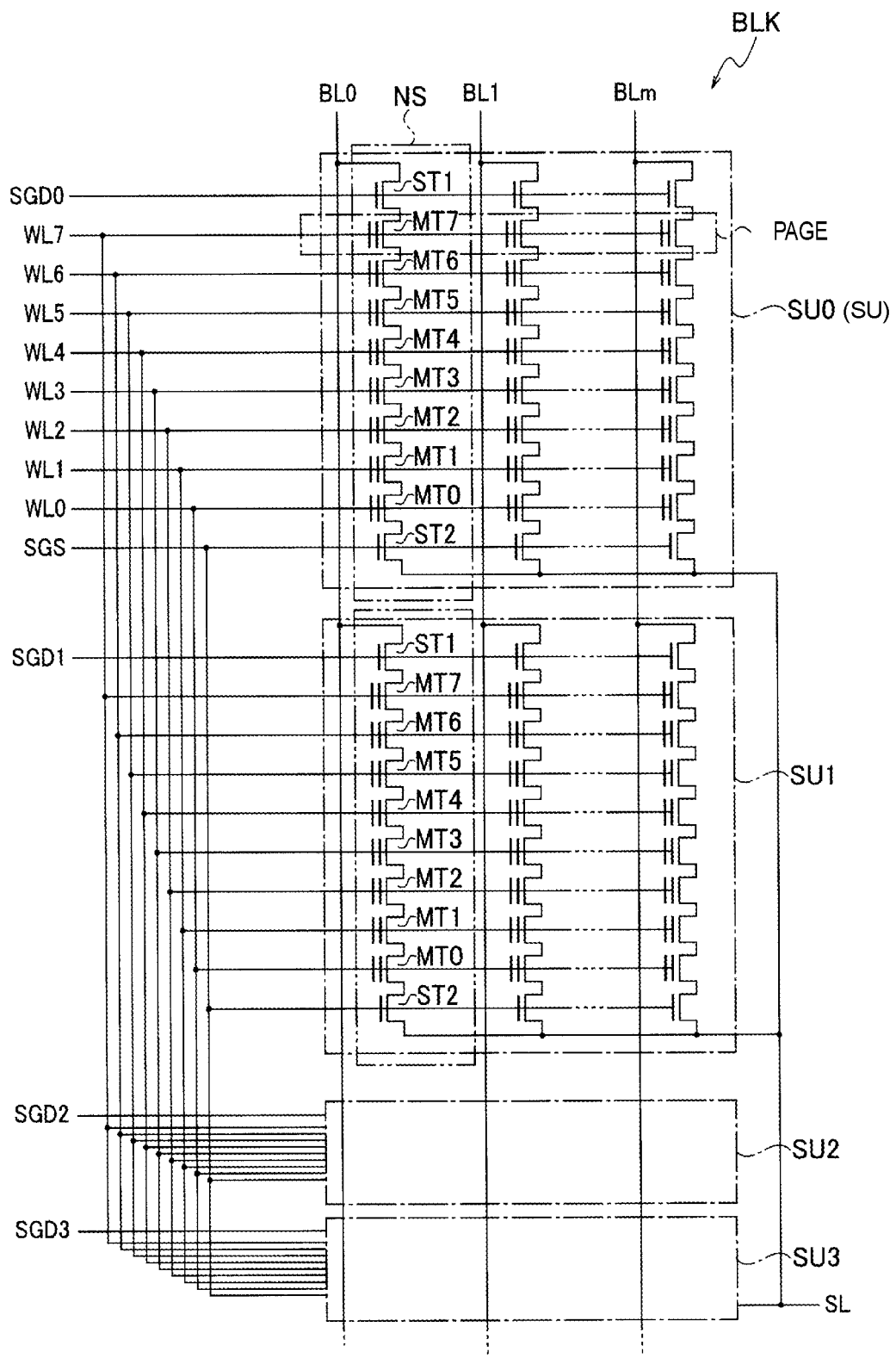
FIG. 5 is a circuit diagram of a block according to an embodiment.

FIG. 5 is a circuit diagram of the block according to the embodiment. FIG. 5 illustrates a circuit configuration for a block BLK in the memory cell array 11. As illustrated in FIG. 5, each block BLK includes four string units SU (SU0, SU1, SU2, SU3).

Each string unit SU includes a plurality of NAND strings NS respectively associated with bit lines BL0, BL1 ... BLm (where m is a natural number). The bit lines BL0 to BLm are shared among a plurality of blocks BLK.

Each NAND string NS includes a plurality of memory cell transistors MT (e.g., MT0 to MT7), a select transistor ST1, and a select transistor ST2. Each of the memory cell transistors MT may store data in a non-volatile manner. The select transistors ST1 and ST2 are used to select the particular string unit SU. In each NAND string NS, the memory cell transistors MT (MT0 to MT7) are connected in series between a source of the select transistor ST1 and a drain of the select transistor ST2.

As described above, select transistors ST1 and ST2 are included in each of the plurality of NAND strings NS included in the same string unit SU. Each of the drains of the plurality of select transistors ST1 is connected to any one of the bit lines BL0 to BLm. The gates of the select transistors ST1 are connected to one of the select gate lines SGD0 to SGD3 according to which string unit SU the respective NAND string NS is located. The sources of the select transistors ST2 are connected in common to one source line SL in each block BLK. The source line SL is also shared among the plurality of blocks BLK. The gates of the plurality of select transistors ST2 are connected in common to one select gate line SGS.

The number of string units SU included in each block BLK and the number of memory cell transistors MT and select transistors ST1 and ST2 included in each NAND string NS are examples, and may be arbitrarily selected. The number of word line WL and select gate lines SGD and SGS changes based on the number of memory cell transistors MT and select transistors ST1 and ST2.

(Temperature Control)

Figure 6:
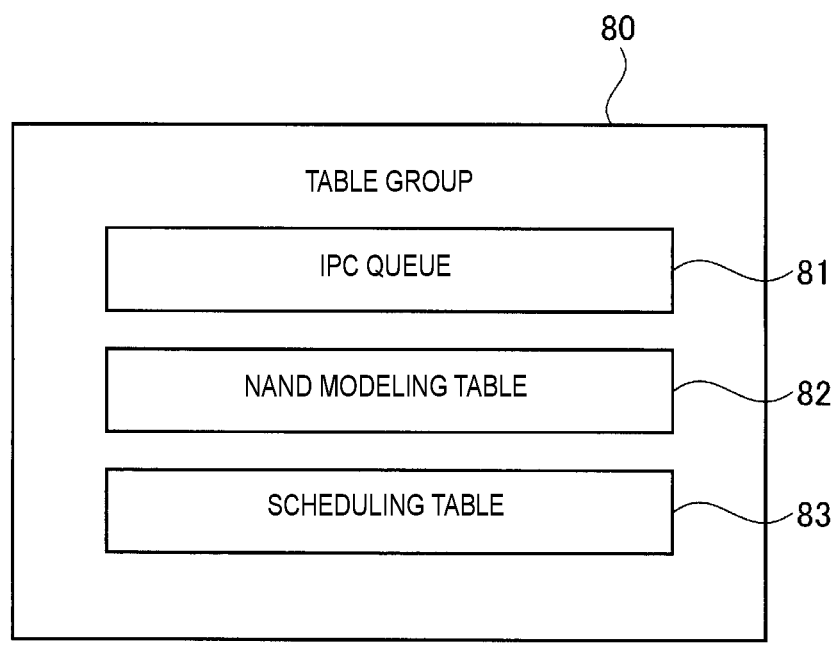
FIG. 6 depicts a table used for temperature control in a memory system according to an embodiment.

FIG. 6 is a block diagram illustrating a table group 80 used for temperature control in the memory system 1 according to the embodiment. The individual tables in the table group 80 used for temperature control in the memory system 1 are an IPC queue 81, a NAND modeling table 82, and a scheduling table 83. The IPC queue 81, the NAND modeling table 82, and the scheduling table 83 are stored in the volatile memory 110 and/or the RAM 22 in the memory controller 20.

In the IPC queue 81, access commands received by the memory system 1 from the host device 2 are stored separately for each of the plurality of dies 10. In this context, an access command is a command for accessing the non-volatile memory 3. Examples of an access command include a read command (RD), a program command (PG), and an erase command (ER).

In the NAND modeling table 82, the critical limit temperature, the current temperature, and temperature modeling information are stored separately for each of the plurality of dies 10. The critical limit temperature and temperature modeling information are established in advance for each of the plurality of dies 10. The critical limit temperature and temperature modeling information can be changeable. The critical limit temperature is an upper limit for the operating temperature set for each die 10 within a predetermined temperature range. The temperature modeling information includes a command operation time required for each access command and a degree of influence of the command operation time on the temperature. The degree of influence of the command operation time on the temperature is, for example, the command operation time required to raise the temperature by 1° C.

The scheduling table 83 is a table created in the memory system 1 based on the access commands stored in the IPC queue 81 and the critical limit temperature, the current temperature, and the modeling information stored in the NAND modeling table 82. The memory system 1 controls the temperature of the die 10 by executing the operations for the access commands on the non-volatile semiconductor memory 3 according to the scheduling table 83.

FIG. 7A is an example of the data structure of the IPC queue 81. In the example of FIG. 7A, the IPC queue 81 in which 7 access commands are stored is illustrated as an access command for the die 10_1. FIG. 7A illustrates an IPC queue 81 in which 10 or more access commands are stored for the die 10_16. The access commands stored in the IPC queue 81 are sequentially executed in the non-volatile memory 3 via the NAND I/F circuit 26. The access commands whose execution has been completed are deleted from the IPC queue 81 after completion.

FIG. 7B is an example of the data structure of the NAND modeling table 82. FIG. 7B illustrates the NAND modeling table 82 when the critical limit temperature of the die 10_1 is 73° C. and the current temperature is 69° C. FIG. 7B illustrates the NAND modeling table 82 when the critical limit temperature of the die 10_2 is 72° C. and the current temperature is 70° C. FIG. 7B illustrates the NAND modeling table 82 when the critical limit temperature of the die 10_16 is 73° C. and the current temperature is 71° C. FIG. 7B illustrates the NAND modeling table 82 with the operation time (busy time) required for one read command for the die 10_1 being 0.1 ms, the command operation time (busy time) required for one program command being 1.0 ms, and the operation time (busy time) required for one erase command being 5.0 ms. The operation time (busy time) required for one read command for the die 10_2 is 0.1 ms, the command operation time (busy time) required for one program command is 1.2 ms, and the operation time (busy time) required for one erase command is 5.2 ms. The operation time (busy time) required for one read command for the die 10_16 is 0.1 ms, the operation time (busy time) required for one program command is 1.1 ms, and the operation time (busy time) required for one erase command is 5.1 ms. The operation time required to raise the temperature on the die 10_1 by 1° C. is 1.5 ms, the operation time required to raise the temperature on the die 10_2 by 1° C. is 1.3 ms, and the operation time required to raise the temperature on the die 10_16 by 1° C. is 1.0 ms.

Next, the firmware 60 (also referred to as a control program 60) used for temperature control by the memory system 1 according to the embodiment will be described.

Figure 8:
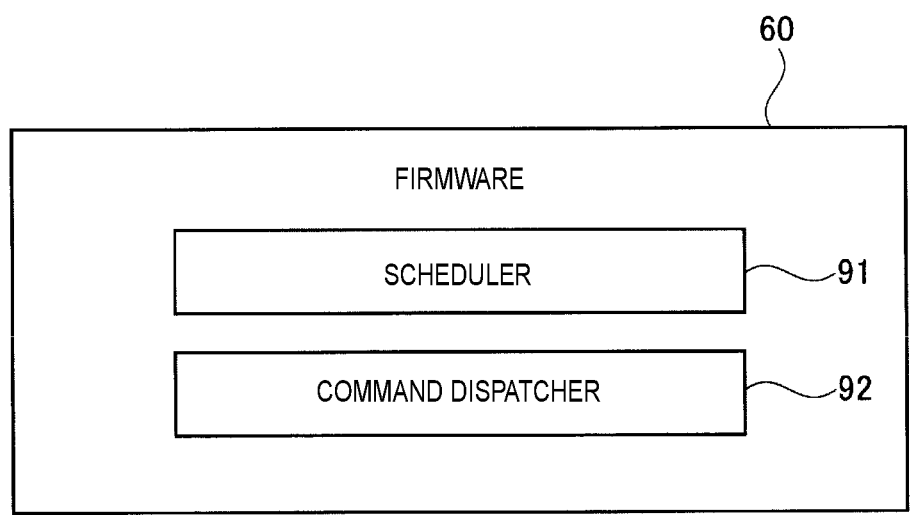
FIG. 8 depicts a functional configuration example of firmware according to an embodiment.

FIG. 8 is a diagram illustrating a functional blocks of an example of the firmware according to the embodiment. The firmware 60 includes a scheduler 91 and a command dispatcher 92.

When the memory system 1 is started, the CPU 21 reads the firmware 60 from the non-volatile memory 3 or a separate ROM and stores the firmware in the RAM 22. Then, the CPU 21 performs the temperature control processing by executing the firmware 60 stored in the RAM 22. In addition to the temperature control processing, the CPU 21 may execute a command processing for processing various commands from the host device 2. A part or all of the temperature control processing may be executed by the dedicated hardware in the memory controller 20 rather than in software.

The scheduler 91 acquires the modeling information form the NAND modeling table 82 and the access commands from the IPC queue 81. Then, the scheduler 91 creates the scheduling table 83 based on the acquired modeling information and the access commands. The scheduler 91 transmits the scheduling table 83 it has created to the command dispatcher 92. The scheduler 91 performs a proportional integral differential (PID) control so that the detected value from each of the plurality of temperature sensors 25 will not exceed the critical limit temperature based on the current temperature stored in the NAND modeling table 82 at the time of scheduling. This enables a gradual rate control.

The command dispatcher 92 acquires temperature information from each of the plurality of temperature sensors 25. The command dispatcher 92 inputs the acquired temperature information as the current temperature into the NAND modeling table 82. The command dispatcher 92 executes an access command based on the scheduling table 83 received from the scheduler 91.

(Processing Flow of Temperature Control by Memory System)

Next, the flow of temperature control processing by the memory system 1 according to an embodiment will be described.

Figure 9:
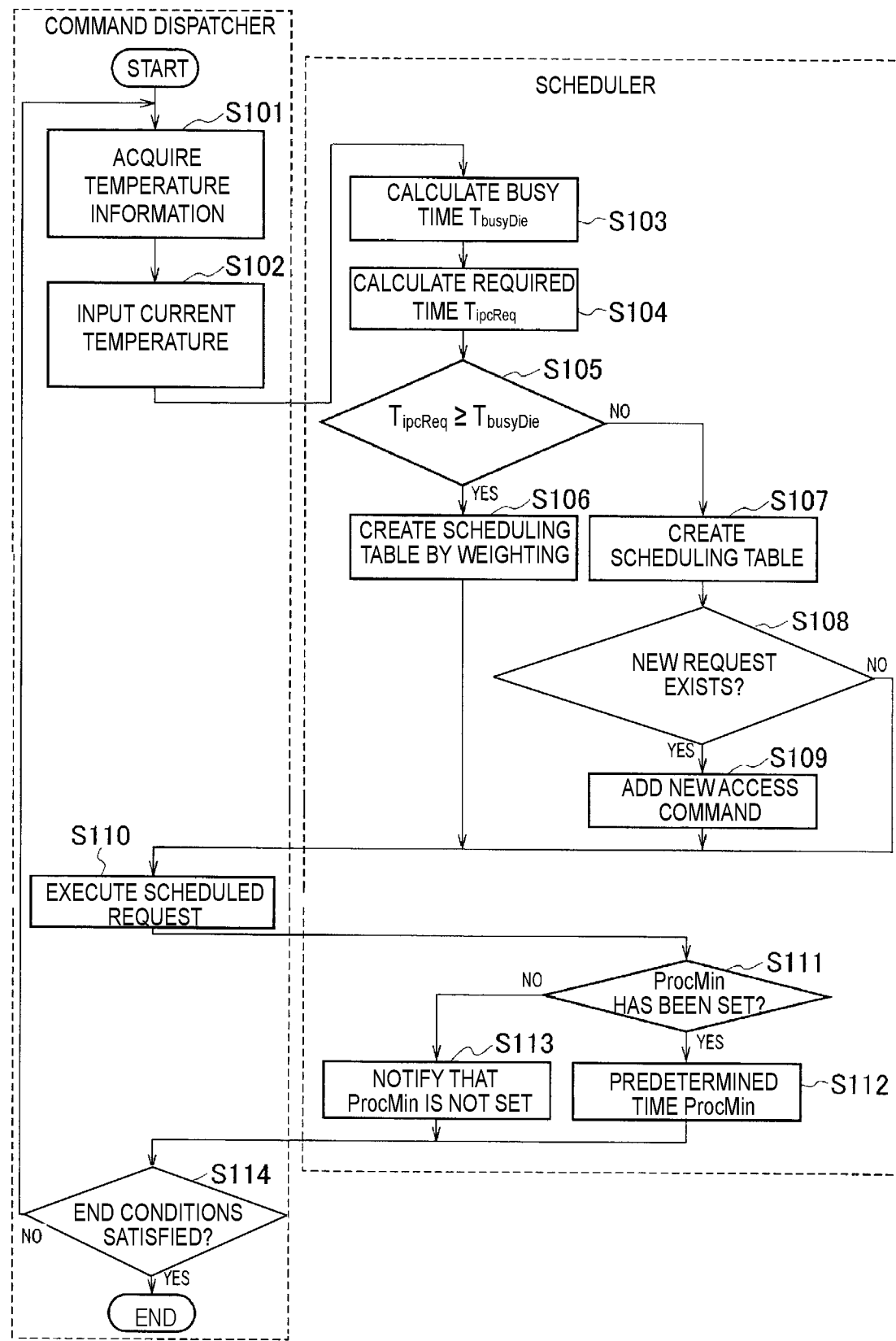
FIG. 9 is a flowchart of a temperature control process in a memory system according to an embodiment.

FIG. 9 illustrates a flowchart of temperature control processing by the memory system 1.

When the host device 2 requests the start of temperature control (start), the command dispatcher 92 acquires temperature information from the temperature sensors 25 provided on each of the dies 10 (S101).

The command dispatcher 92 inputs the acquired temperature information as the current temperature into the NAND modeling table 82 (S102). Then, the command dispatcher 92 notifies the scheduler 91 that the processing of S102 is completed.

When notified that the processing of S102 is completed, the scheduler 91 next calculates the busy time $T_{busyDie}$ based on the limit temperature, the current temperature, and the modeling information stored in the NAND modeling table 82 (S103). The busy time $T_{busyDie}$ is calculated for each of the plurality of dies 10. The busy time $T_{busyDie}$ may be calculated by multiplying the operation time required to raise the temperature by 1° C. (rising time) by the difference between the limit temperature and the current temperature. In the example of FIG. 7B, the busy time $T_{busyDie}$ for the die 10_1 is rising time (1.5 ms/° C.)×the difference between the limit temperature and the current temperature (4° C.)=6.0 ms. Similarly, the busy time $T_{busyDie}$ for the die 10_2 is the rising time (1.3 ms/° C.)×the difference between the limit temperature and the current temperature (2° C.)=2.6 ms. Similarly, the busy time $T_{busyDie}$ for the die 10_16 is the rising time (1.0 ms/° C.)×the difference between the limit temperature and the current temperature (2° C.)=2.0 ms.

The scheduler 91 calculates the required time $T_{ipcReq}$ for each of the plurality of dies 10 based on the access commands stored for each of the plurality of dies 10 in the IPC queue 81 (S104). FIG. 7A illustrates the IPC queue 81 in which there are five read commands (RD), one program command (PG), and one erase command (ER) in the queue for die 10_1. FIG. 7B exemplifies the NAND modeling table 82 in which the time required to execute one read command (RD) for the die 10_1 is 0.1 ms, the time required to execute one program command (PG) is 1.0 ms, and the time required to execute one erase command (ER) is 5.0 ms. Therefore, the required time $T_{ipcReq}$ is the time required to execute one read command (RD)×the number of queued read commands (RD)+the time required to execute one program command (PG)×the number of queued program commands (PG)+the time required to execute one erase command (ER)×the number of queued erase commands (ER)=0.1 ms×5+1.0 ms×1+5.0 ms+1=6.5 ms.

The scheduler 91 then determines whether the required time $T_{ipcReq}$ calculated in S104 is equal to or greater than the busy time $T_{busyDie}$ calculated in S103 (S105).

When it is determined that the required time $T_{ipcReq}$ calculated in S104 is equal to or greater than the busy time $T_{busyDie}$ calculated in S103 ("YES" in S105), the scheduler 91 weights the access commands in the IPC queue 81 to create the scheduling table 83 (S106). That is, the scheduler 91 arranges the scheduling table 83 so that the temperature of each die 10 does not exceed the limit temperature. Then, the scheduler 91 notifies the command dispatcher 92 that the processing of S106 is completed.

When notified that the processing of S106 is completed, the command dispatcher 92 executes an access command based on the scheduling table 83 that was created by the scheduler 91 in step S106 (S110). Then, the command dispatcher 92 notifies the scheduler 91 that the processing of S110 is completed.

When it is determined that the required time $T_{ipcReq}$ calculated in S104 is not equal to or greater than the busy time $T_{busyDie}$ calculated in S103 ("NO" in S105), the scheduler 91 creates a scheduling table 83 so as to execute all the access commands without weighting or the like (S107).

Furthermore, after the scheduler 91 finds that the required time $T_{ipcReq}$ is less than the busy time $T_{busyDie}$ in S105 (No), the scheduler 91 checks whether a new access command (request) has been added to the IPC queue 81 (S108).

When a new access command has been added to the IPC queue 81 ("YES" in S108), the scheduler 91 will add the new access command to the scheduling table 83 in step S109 (S109). Then, the scheduler 91 notifies the command dispatcher 92 that the processing of S109 is completed.

When notified that the processing of S109 is completed, the command dispatcher 92 executes an access command based on the scheduling table 83 created by the scheduler 91 in steps S107 and S109 (S110). Then, the command dispatcher 92 notifies the scheduler 91 that the processing of S110 is completed.

When no new request has been added to the IPC queue 81 ("NO" in S108) after the scheduler 91 finds that the required time $T_{ipcReq}$ is less than the busy time $T_{busyDie}$ in S105 (No), the scheduler 91 notifies the command dispatcher 92 that the processing of S108 is completed.

When notified that the processing of S108 is completed, the command dispatcher 92 executes (S110) an access command based on the scheduling table 83 created by the scheduler 91 in step S107. Then, the command dispatcher 92 notifies the scheduler 91 that the processing of S110 is completed.

When notified that the processing of S110 is completed, the scheduler 91 next determines whether the tuning parameter ProcMin has been set (S111). The tuning parameter ProcMin is a set value of the waiting time to be inserted between the access commands that are executed on a die 10.

When it is determined that the tuning parameter ProcMin has been set ("YES" in S111), the scheduler 91 inserts a waiting time between the access commands executed for the die 10. The scheduler 91 does not execute the access command during the inserted waiting time ($t_{breakPoint}$) (S112). That is, the memory controller 20 transmits a response corresponding to the access command to the host device 2 only after the time set as the waiting time elapses after the execution of the process corresponding to the access command is completed. As the waiting time becomes longer, the degree of suppression of the performance of the memory system 1 becomes greater.

When it is determined that the tuning parameter ProcMin has not been set ("NO" in S111), the scheduler 91 notifies the command dispatcher 92 that the tuning parameter ProcMin is not set ("NO" in S113).

When the scheduler 91 notifies that the tuning parameter ProcMin has not been set, the command dispatcher 92 next determines whether the host device 2 has requested the end of the temperature control by the memory system 1 (S114).

Alternatively, when the scheduler 91 notifies that the processing of S112 is completed, it can be determined whether the host device 2 has requested the end of the temperature control by the memory system 1 (S114).

When the host device 2 notifies that the power of the host device 2 has been turned off ("YES" in S114) or the like, the command dispatcher 92 ends the series of processes.

When the host device 2 has not notified that the power of the host device 2 has been turned off ("NO" in S114), the command dispatcher 92 executes the process of S101 again (returns to S101).

Figure 10:
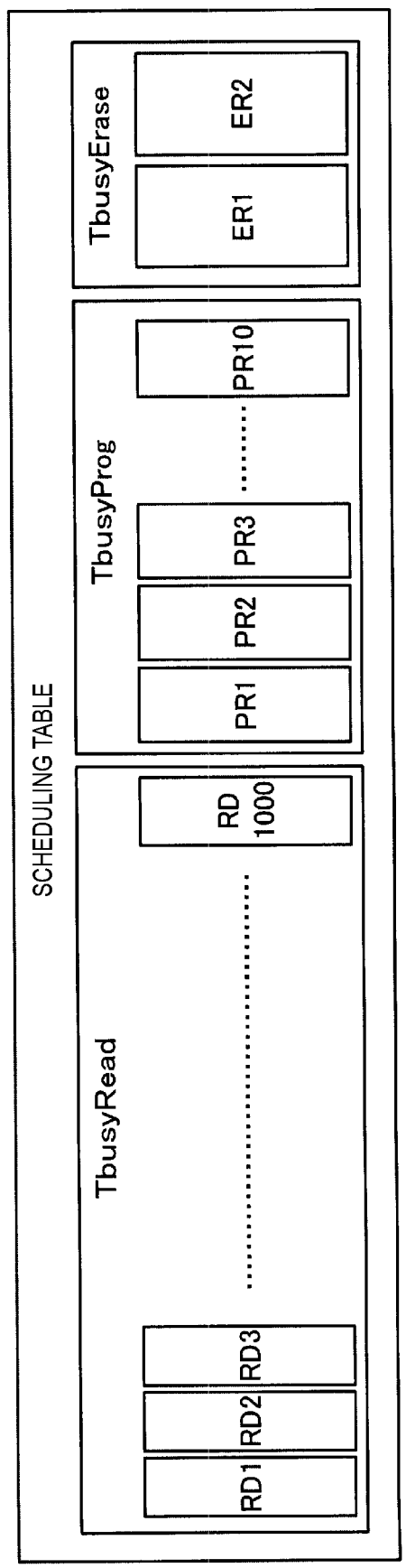
FIG. 10 is a schematic diagram of a scheduling table used in temperature control by a memory system according to an embodiment.

FIG. 10 illustrates a schematic diagram of the scheduling table 83 used in the temperature control by the memory system 1 according to the embodiment. FIG. 11 illustrates a schematic diagram of a weighting table used in temperature control by the memory system 1 according to the embodiment. FIG. 11 illustrates a weighting table with the weight for a read command being 1, the weight for a program command being 100, and the weight for an erase command being 500. In this case, assuming that the scheduler 91 evenly allocates a read command operation time $T_{busyRead}$, a program command operation time $T_{busyProg}$, and an erase command operation time $T_{busyErase}$ (i.e., $T_{busyRead}:T_{busyProg}:T_{busyErase}=1:1:1$), the scheduler 91 sets the scheduling table 83 so that the number of program commands will be ten (10) and the number of erase commands will be two (2) for every 1000 read commands scheduled, as illustrated in FIG. 10.

Further, the ratio of the read command operation time $T_{busyRead}$, the program command operation time $T_{busyProg}$, and the erase command operation time $T_{busyErase}$, that is, ($T_{busyRead}:T_{busyProg}:T_{busyErase}$) may be adjusted according to the drive state of the non-volatile memory 3 and the drive requirements. The ratio $T_{busyRead}:T_{busyProg}:T_{busyErase}$ may also be adjusted dynamically. Dynamically adjusting the ratio $T_{busyRead}:T_{busyProg}:T_{busyErase}$ in this context means adjusting the value of the ratio $T_{busyRead}:T_{busyProg}:T_{busyErase}$ at a predetermined time or at regular intervals during the operation of the memory system 1. The predetermined time is, for example, the timing of a cycle of the temperature control processing.

Figure 12:
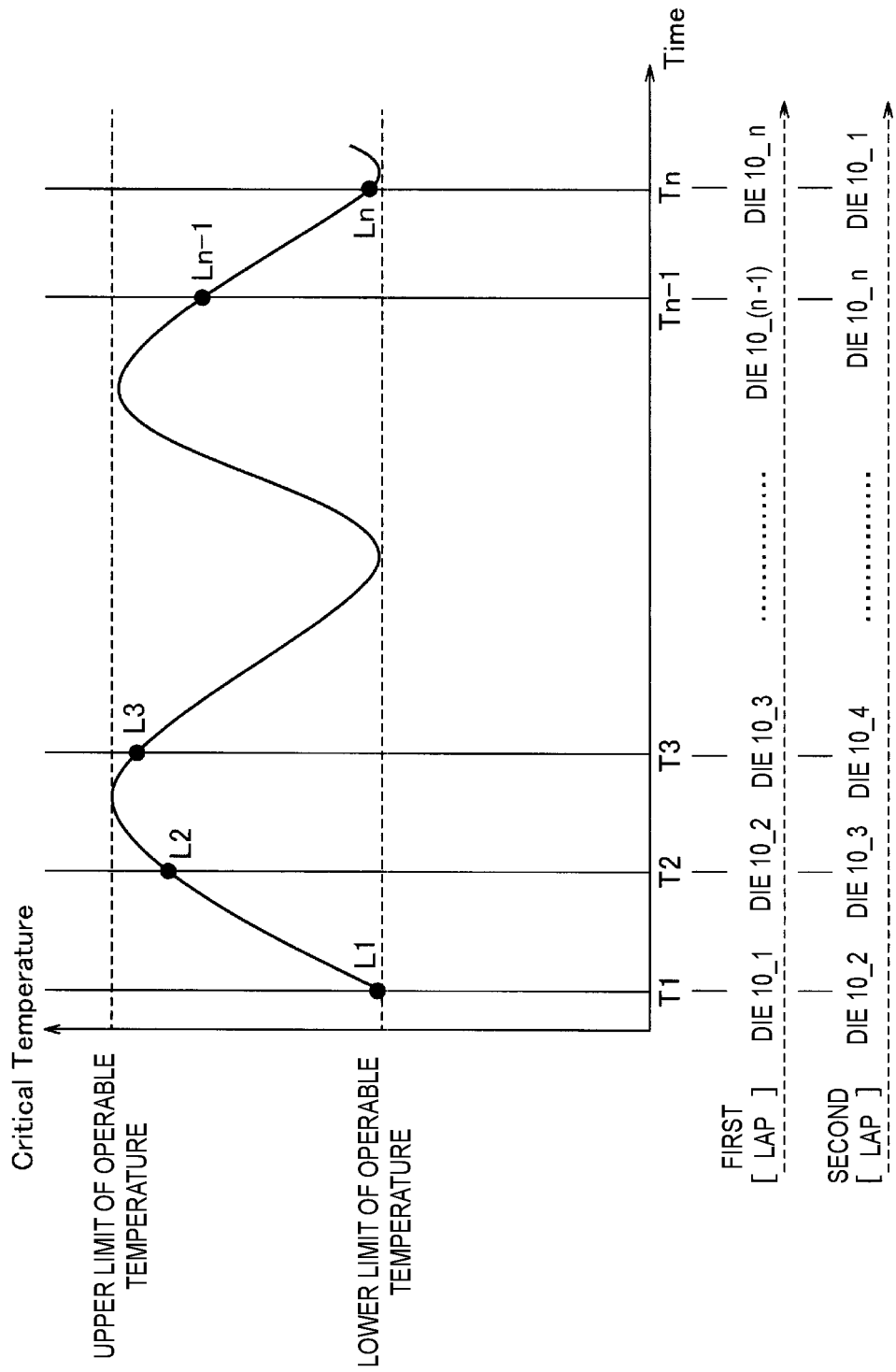
FIG. 12 depicts aspects related to an operation timing for temperature control for each die by a memory system according to an embodiment.

FIG. 12 illustrates a schematic diagram of the operation timing of temperature control for each die 10 by the memory system according to the embodiment.

The memory system according to the present embodiment dynamically changes the limit temperature for each die 10. Dynamically adjusting the limit temperature means adjusting the value of the limit temperature at a predetermined timing within a predetermined temperature range during the operation of the memory system 1. The predetermined timing is, for example, the timing of a cycle of the temperature control process. For example, as illustrated in FIG. 12, for the die 10_1 that executes a temperature control at time T1, the limit temperature is set to a value L1 close to the lower limit of the operable temperature. Further, for example, as illustrated in FIG. 12, for the die 10_2 that executes the temperature control at time T2, the limit temperature is set to a value L2 close to the upper limit of the operable temperature. For the die 10_3 that executes the temperature control at time T3, the limit temperature is set to a value L3 close to the upper limit of the operable temperature. For the die 10 (n−1) that executes the temperature control at time Tn−1, the limit temperature is set to a value L (n−1) close to the upper limit of the operable temperature. Further, for the die 10_n that executes the temperature control at time Tn, the limit temperature is set to a value Ln close to the lower limit of the operable temperature.

The memory system according to the present embodiment can change the operation timing of each die 10 for each cycle of the temperature control process. For example, as illustrated in FIG. 12, the die 10_1 operated at time T1 on a first lap is operated at time Tn on a second lap. For the die 10_1 that executes the temperature control at time Tn, the limit temperature is set to a value Ln close to the lower limit of the operable temperature. For example, as illustrated in FIG. 12, the die 10_2 operated at time T2 on the first lap is operated at time T1 on the second lap. For the die 10_2 that executes the temperature control at time T1, the limit temperature is set to a value L1 that is close to the lower limit of the operable temperature. Furthermore, for example, as illustrated in FIG. 12, the die 10_3 operated at time T3 on the first lap is operated at time T2 on the second lap. For the die 10_3 that executes the temperature control at time T2, the limit temperature is set to a value L2 close to the upper limit of the operable temperature.

Since the memory system 1 according to the present embodiment is provided with temperature sensors for each of the plurality of dies 10, a thermal throttling for each individual die 10 is possible. Further, the memory system 1 according to the present embodiment may also optimize the usage rate of the non-volatile semiconductor memory.

The memory system 1 according to the present embodiment performs a temperature control for each of the plurality of dies 10 in consideration of the required time $T_{ipcReq}$ and the busy time $T_{busyDie}$. Therefore, the load of the plurality of dies 10 may be distributed so that the temperature control is fairly shared (spread) among all command operations. In addition, the possibility that the drive will not respond due to temperature control is reduced, and the responsiveness is improved from the viewpoint of the host device 2.

The memory system 1 according to the present embodiment uses many tuning parameters such as the critical limit temperature, current temperature, modeling information, busy time $T_{busyDie}$, required time $T_{ipcReq}$, read command operation time $T_{busyRead}$, program command operation time $T_{busyProg}$, and erase command operation time $T_{busyErase}$. As the number of tuning parameters increases, more design options are possible. These tuning parameters may be dynamically assigned based on the drive state machine.

Furthermore, performing the temperature control processing in units of ten dies 10, can also be effective as a die-level architecture by the host device 2 such as IOD (I/O die).

As described above, according to the memory system 1 according to the present embodiment, the temperature rise may be suppressed and the performance and reliability may be improved by controlling the temperature at the die level of the non-volatile semiconductor memory.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a non-volatile semiconductor memory including a plurality of dies;
temperature sensors for each of the dies; and
a memory controller configured to:
receive access commands for accessing the non-volatile semiconductor memory, and
control accessing of the non-volatile semiconductor memory according to the received access commands by scheduling execution of the received access commands for each die based on the temperature of the die measured by the temperature sensor for the die, a preset limit temperature for each die, and access command type of the received access commands.

2. The memory system according to claim 1, wherein
the memory controller includes a command dispatcher and a scheduler,
the command dispatcher is configured to:
acquire the temperature of each die,
store the acquired temperature for each die and the preset limit temperature for each die in association with each other in a modeling table, and
execute an operation associated an access command according to a scheduling table, and
the scheduler is configured to generate the scheduling table based on the modeling table and the received access commands.

3. The memory system according to claim 2, wherein
the modeling table includes a command operation time and a degree of influence for each type of access command and each die, and
the scheduling table is additionally based on the command operation time and the degree of influence associated with the received access commands in addition to the measured temperature of the dies and the preset limit temperature of the dies.

4. The memory system according to claim 3, wherein the scheduler is configured to:
calculate a busy time and a required time for each of the dies based on the measured temperature, the preset limit temperature, the command operation time, the degree of influence, and the received access commands, and create the scheduling table to execute all of the received access commands if the calculated required time is less than the busy time.

5. The memory system according to claim 3, wherein the scheduler is configured to:
calculate a busy time and a required time for each of the dies based on the measured temperature, the preset limit temperature, the command operation time, the degree of influence, and the received access commands, and
weight the access commands to create the scheduling table so that a temperature of a die does not exceed the preset limit temperature for the die if the calculated required time is greater than or equal to the busy time.

6. The memory system according to claim 5, wherein the scheduler adjusts a weighting for each access command type for each die according to a predetermined command operation time for each access command type for the die.

7. The memory system according to claim 6, wherein the scheduling table is generated according to a ratio of the command operation times predetermined for each of the dies.

8. The memory system according to claim 7, wherein the scheduler is configured to adjust a value of the ratio of the command operation time at a predetermined timing.

9. The memory system according to claim 8, wherein the predetermined timing matches a cycle of a temperature control process for the plurality of dies.

10. The memory system according to claim 2, wherein the scheduler is configured to adjust a value of the preset limit temperature for each die at a predetermined timing, the value of the preset limit temperature being within an operable temperature range the dies.

11. The memory system according to claim 10, wherein the predetermined timing matches a cycle of a temperature control process for the plurality of dies.

12. A memory controller, comprising:
a first interface connectable to a host device;
a second interface connectable to a non-volatile semiconductor memory having a plurality of dies; and
a processor configured to:
receive access commands for accessing the non-volatile semiconductor memory via the first interface, and
control accessing of the non-volatile semiconductor memory via the second interface according to the received access commands by scheduling execution of the received access commands for each die based on a temperature of the die as measured by a temperature sensor on the die, a preset limit temperature for each die, and access command type of the received access commands.

13. The memory controller according to claim 12, further comprising:
a third interface connectable to a volatile memory, wherein
the volatile memory stores measured temperatures for each die, the preset limit temperature for each die, a command operation time for each die for different access command types, and an operation time required to raise the temperature of each die by a unit amount.

14. The memory controller according to claim 12, wherein the processor is further configured to:
acquire the temperature of each die,
store the acquired temperature for each die and the preset limit temperature for each die in association with each other in a modeling table,
generate a scheduling table based on the modeling table and the received access commands, and
execute an operation associated an access command according to the scheduling table.

15. The memory controller according to claim 14, wherein
the modeling table includes a command operation time and a degree of influence for each type of access command and each die, and
the scheduling table is additionally based on the command operation time and the degree of influence associated with the received access commands in addition to the measured temperature of the dies and the preset limit temperature of the dies.

16. The memory controller according to claim 15, wherein the processor is further configured to:
calculate a busy time and a required time for each of the dies based on the measured temperature, the preset limit temperature, the command operation time, the degree of influence, and the received access commands, and
create the scheduling table to execute all of the received access commands if the calculated required time is less than the busy time.

17. The memory controller according to claim 15, wherein the processor is further configured to:
calculate a busy time and a required time for each of the dies based on the measured temperature, the preset limit temperature, the command operation time, the degree of influence, and the received access commands, and
weight the access commands to create the scheduling table so that a temperature of a die does not exceed the preset limit temperature for the die if the calculated required time is greater than or equal to the busy time.

18. The memory controller according to claim 17, wherein the scheduler adjusts a weighting for each access command type for each die according to a predetermined command operation time for each access command type for the die.

19. A method of controlling a non-volatile memory including a plurality of dies, the method comprising:
receiving access commands for accessing a non-volatile semiconductor memory; and
controlling the accessing of the non-volatile semiconductor memory according to the received access commands by scheduling execution of the received access commands for each die based on a temperature of the die measured by a temperature sensor on the die, a preset limit temperature for each die, and access command type of the received access commands.

20. The method of claim 19, further comprising:
calculating a busy time and a required time for each of the dies based on the measured temperature, the preset limit temperature, a command operation time for each access command type for each die, an expected temperature rise per unit operation time for each die, and the received access commands, and
weighting the access commands to create a scheduling table so that a temperature of a die does not exceed the preset limit temperature for the die if the calculated required time is greater than or equal to the busy time.

* * * * *